(12) United States Patent  
Sullivan

(10) Patent No.: US 6,992,287 B2  
(45) Date of Patent: Jan. 31, 2006

(54) APPARATUS AND METHOD FOR IMAGE OPTIMIZATION OF SAMPLES IN A SCANNING ELECTRON MICROSCOPE

(75) Inventor: Neal T. Sullivan, Lunenburg, MA (US)

(73) Assignee: Soluris, Inc., Concord, MA (US)

( * ) Notice: Subject to any disclaimer, the term of this patent is extended or adjusted under 35 U.S.C. 154(b) by 0 days.

(21) Appl. No.: 10/985,144

(22) Filed: Nov. 10, 2004

(65) Prior Publication Data

US 2005/0098724 A1    May 12, 2005

Related U.S. Application Data

(63) Continuation of application No. 10/272,763, filed on Oct. 17, 2002, now abandoned.

(51) Int. Cl.  
    G21K 7/00    (2006.01)  
    G21G 5/00    (2006.01)  
(52) U.S. Cl. ..................... 250/306; 250/492.3  
(58) Field of Classification Search ............... 250/308, 250/311, 310, 492.3, 306  
See application file for complete search history.

(56) References Cited

U.S. PATENT DOCUMENTS

| 5,731,580 A * | 3/1998 | Sato et al. ................. 250/130 |
| 6,066,849 A * | 5/2000 | Masnaghetti et al. ....... 250/310 |
| 2002/0036264 A1 * | 3/2002 | Nakasuji et al. ........... 250/306 |

* cited by examiner

*Primary Examiner*—John R. Lee  
*Assistant Examiner*—Kalimah Fernandez  
(74) *Attorney, Agent, or Firm*—Cohen, Pontani, Lieberman & Pavane

(57) ABSTRACT

A system and method for identifying an optimal landing energy of a probe current in a scanning electron microscope system. A probe current having a known landing energy is directed at a sample for producing a signal electron beam. The current of the signal electron beam is measured by directing the beam to a current detector for calculating a current yield, which is the ratio of the signal current to the probe current. The landing energy can then be changed for subsequent measurements of the signal current to identify the landing energy which produces a desired current yield. Once identified, the landing energy value can be used to produce a signal electron beam directed towards an imaging detector to generate topographic images of samples.

12 Claims, 2 Drawing Sheets

APPARATUS AND METHOD FOR IMAGE OPTIMIZATION OF SAMPLES IN A SCANNING ELECTRON MICROSCOPE

This is a continuation of application Ser. No. 10/272,763, filed Oct. 17, 2002 now abandoned.

BACKGROUND OF THE INVENTION

1. Field of the Invention

The present invention relates to scanning electron microscopes used for obtaining topography images of samples. More particularly, the present invention provides a method and system for improving the image obtained by a scanning electron microscope by optimizing the electron yield.

2. Description of the Related Art

Conventional scanning electron microscopes (SEM) are used to obtain topographic images of a sample surface to detect, for example, imperfections on the sample surface. This is accomplished by generating a probe current which is directed in a raster pattern at the sample surface. The interaction of the electrons in the probe current with the sample surface produces secondary electrons (which are released from the sample surface due to bombardment by the probe current electrons) and backscattered electrons (which are, in effect, the probe current electrons reflected by the sample surface). The secondary and backscattered electrons are referred to herein as a signal electron beam (or signal current) and is directed to an imaging detector which produces an image of the sample surface. The interaction of the electrons in the probe current with the sample also causes absorption of some of the probe current electrons into the sample or dissipation of sample electrons from the sample surface, which results in the sample becoming negatively or positively charged, respectively. Such charging has an adverse affect on the accuracy of sample surface image detection because, for example, a positively charged sample surface will capture the probe current electrons, thereby causing a dark region to appear on the sample image as a result of the lack of, or a diminished amount of, signal electrons.

An analytical tool widely used in categorizing and analyzing samples is a yield curve as shown in FIG. 1. A yield curve is a plot of the ratio of the signal electron beam and probe current with respect to the landing energy of the probe current on the sample. An ideal condition is reached for a yield value of "1" corresponding to equal values of the signal electron beam current and the probe current. As shown in curve A of FIG. 1, two landing energy values correspond to the ideal yield condition, shown as $E_1$ and $E_2$. The shape of the yield curve indicates a more gradual change at $E_2$ relative to $E_1$ such that minor variations of the landing energy proximate the $E_2$ value result in only minor variations of the signal current. For this reason, using a landing energy of $E_2$ to obtain an optimal topographic sample image is more desirable than a landing energy of $E_1$.

Prior art techniques for locating the optimal energy $E_2$ for use in irradiating samples with the probe current are qualitative and are typically performed by a microscope technician in programming a microscope so that optimal landing energy values can be preset for a variety of samples to be examined. Such qualitative techniques entail measuring the probe current strength, such as by positioning an electron detector (e.g., a Faraday cup, etc.) in a path of the probe current, and obtaining an image of the sample by receiving the signal electron beam at an imaging detector. By obtaining various images at different landing energies and/or probe currents, the images are visually compared to select the optimal image, which corresponds either to landing energy $E_1$ or $E_2$. By obtaining additional images at landing energies proximate the values of $E_1$ and $E_2$ deduction will lead to distinguishing $E_1$ from $E_2$ using the known characteristics of the yield curve. Once the value of $E_2$ is ascertained, that value will then be used to examine other like samples, such as in a quality control stage of a semiconductor substrate manufacturing facility.

A problem of the prior art qualitative approach in locating a desired landing energy $E_2$ is that although the level of the probe current is known from the use, for example, of a Faraday cup positioned in the probe current path, the signal current received by the imaging detector is not known. Thus, an SEM technician trying to locate an optimal landing energy for producing a satisfactory sample image must do so through trial and error by, for example, setting a first landing energy and obtaining an image therefrom, and then repeating the process at other landing energy values to obtain subsequent images. This procedure is not only laborious but results in a subjective determination by the technician as to what is the "best" image.

SUMMARY OF THE INVENTION

The drawbacks of the prior art techniques used for obtaining topographic images of samples are alleviated by providing a method for obtaining quantitative readings of a signal electron beam produced by irradiating a sample surface with a probe current of a scanning electron microscope (SEM). This is accomplished by measuring the probe current and directing secondary electrons, which are produced from the irradiation of the sample surface, to a current detector for obtaining a current measurement of the signal electrons. The irradiation process is repeated at multiple landing energies of the probe current, and the landing energy corresponding to a value of a ratio of the signal electron beam measurement to the probe current measurement is used to identify a landing energy value for obtaining optimal topographic images of samples. Once the optimal landing energy value is identified, that value is used to irradiate other like samples to obtain optimal images of such sample surfaces.

In one embodiment, the landing energy corresponding to a signal electron beam and probe current ratio value of approximately "1" is deemed the optimal landing energy.

In another embodiment, the signal electron beam is measured by disposing a current detector coplanar with, and angularly offset from, an imaging detector used to obtain topographic images of samples.

In still another embodiment, a current detector is selectively moved to a first position to receive the signal electron beam and to a second position to allow the signal electron beam to be received by the imaging detector.

A system is also disclosed for identifying optimal landing energies of a probe current so that topographic images of sample surfaces can be obtained by selecting landing energies of the probe current to be proximate the optimal landing energy value. This is accomplished by a scanning electron microscope having an electron source for generating the probe current along a probe current path in a direction toward the sample plane for producing a signal current when the probe current irradiates a sample positioned on the sample plane. The microscope includes a probe current detector positioned for receiving at least a portion of the probe current for measuring the probe current, and an imaging detector positioned for receiving at least a portion of the signal electron beam. A controller is included for adjusting a landing energy of the probe current, and a current detector is included and is positioned for receiving at least a portion of the signal electron beam. The microscope also includes means for selectively directing at least a portion of the signal electron beam to either the imaging detector or the current detector.

Other objects and features of the present-invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, wherein like reference characters denote similar elements throughout the several views.

DETAILED DESCRIPTION OF THE PRESENTLY PREFERRED EMBODIMENTS

Figure 2:
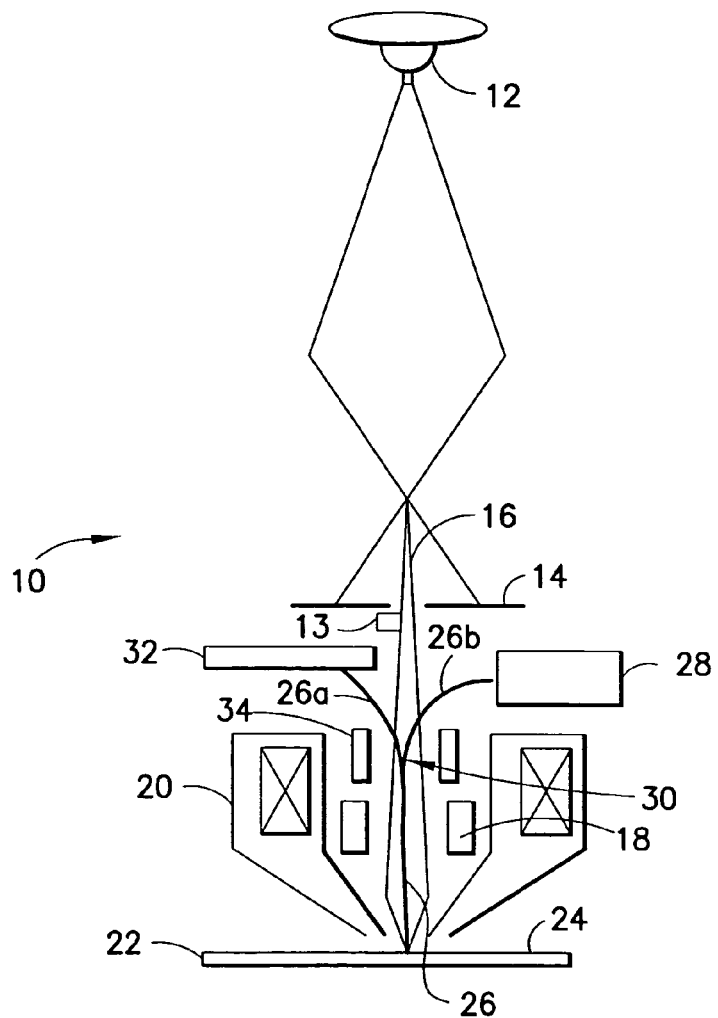
FIG. 2 is a schematic illustration of a scanning electron microscope in accordance with the present invention.

A scanning electron microscope 10 in accordance with the present invention is depicted in FIG. 2 and includes an electron source 12 for generating a principal beam or probe current 16 for irradiating a sample 24, such as a silicon wafer containing multiple devices (not shown). The sample is positioned at a sample table or sample plane 22. As is well known in the art, electron source 12 is capable of selectively generating probe currents at varying intensities. The generated beam is directed at an aperture 14 for refinement prior to impacting the sample 24 and is also acted upon by electro-optic components, such as a scanner 18, for directing the beam to the sample in a raster pattern, and a lens 20 for focusing the beam onto the sample 24. The probe current 16 is also acted upon by electronic forces and/or components such as sample bias, electron gun voltage and electrostatic elements within the microscope column (generally shown as element 30) which, as is known in the art, adjust or control the acceleration of the electrons in the probe current, thereby allowing user-selection of the probe current landing energy.

As explained above, the bombardment or irradiation of a sample surface, e.g. a silicon wafer, with a probe current produces several physical phenomena which are dependent on the landing energy of the probe current. In general, the irradiation will produce backscattered electrons which are reflected from the sample surface, and secondary electrons which are discharged from the sample through collision with the probe current electrons. At certain landing energies and/or for certain types of samples, the sample 24 may become either positively charged or negatively charged, depending on the absorption or desorption of the probe current or the emission of sample electrons that are emitted from the sample due to interaction with the probe current. The backscattered and secondary electrons combine to form a signal electron beam 26.

In prior art SEM systems, the signal electron beam would be intercepted by, or be directed to, an imaging detector 28, such as a microchannel plate as is known in the art, for producing a topographic image of the sample. The location or relative position of the imaging detector is dictated by the desired electron collection efficiency as well as by the particular application, such as the type of sample material under investigation and the material surface shape. Although in such prior art systems the intensity of the probe current is typically known—such as by the use of a Faraday cup or other type of current detector 13 positioned in the path of the probe current or on the sample holder 22 to measure the strength of the beam that impacted the sample 24—the strength of the signal electron beam 26 was not known. Rather, only a topographic image produced from receipt of the signal electron beam by the imaging detector 28 was known. As discussed above in connection with FIG. 1, an optimal topographic image of the sample occurs when a yield ratio (the ratio of the signal electron beam to the probe current—the ordinate of the curve of FIG. 1) is proximate the value "1", and this yield ratio value corresponds to an abscissa coordinate value of landing energy values $E_1$ and $E_2$. Thus, it is desirable for an SEM microscope operator to be able to easily and quickly identify the landing energy values $E_1$ and $E_2$ (or preferably $E_2$) for producing the optimal sample images. Once the optimal landing energies are ascertained, the landing energy $E_2$ can then be programmed to memory, for example, on the SEM, for use in obtaining images of samples.

In accordance with the present invention as shown in FIG. 2, a quantitative measurement of the signal electron beam is obtained by providing a current detector 32 located in a position to intercept the signal electron beam 26 to, in effect, obtain a measurement of the signal that will be used to produce an image of the sample 24. Thus, the signal electron beam current 26 that will be used to produce a topographic image when directed at the imaging detector 28, will be measured by the current detector. In this manner, the electron yield can be precisely calculated from the signal electron beam and probe current measurements, and then plotted for different landing energy values to identify the optimal landing energies $E_1$ and $E_2$ and to distinguish these optical landing energies from each other. In other words, the yield ratio at different landing energies will be calculated, such as by use of a processor (not shown) having an operation well known to those of ordinary skill in the art, until the yield ratio having a value approximating "1" is located, whereupon the landing energies corresponding to that yield value is then subsequently used for obtaining images of like samples.

Figure 1:
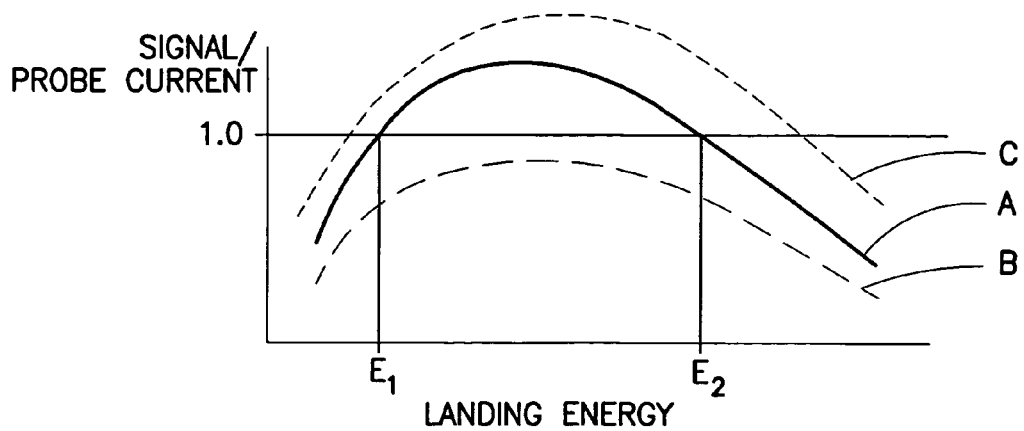
FIG. 1 depicts different graphs of electron yield verses beam energy relationships of a sample irradiated by a scanning electron microscope at different probe current values.

The direct measurement of the signal electron beam by the current detector 32 also allows for the generation of yield curves at different probe current values, i.e. at different probe current intensities and/or scan rates, which provides guidance on the characteristics of samples under charge conditions. With reference to FIG. 1, yield curves such as B and C may be obtained at constant probe current and/or scan rate values other than the probe current and/or scan rate value used to produce curve A. Thus, by obtaining yield curves at different constant probe current values, charge characteristics of samples can also be used to select an optimal value for the probe current.

To obtain an accurate detection of the signal electron beam, the current detector 32 must be located in a specific position to intercept a level of the signal electron beam that will be received by the imaging detector 28. In a preferred embodiment, this is accomplished through proper alignment of the current detector 32 relative to the imaging detector 28. One technique for obtaining proper alignment is to bias the sample 24 to simulate a reflector, such as by applying a voltage (e.g., 9 keV) to the sample that is equal in magnitude to the voltage of the probe current. Such an applied bias causes the probe current to reflect from the sample surface, and the reflected beam can then be used as a reference for alignment and positioning of the current detector 32 as well as for alignment of other microscope components such as lens 20.

In one embodiment, the location of the current detector is preferably coplanar with the imaging detector, as shown in FIG. 2, and angularly offset therefrom, such as at an angle of 180°. For this described embodiment, an electron router, such as a Wien filter 34 operating in a manner that is well known by those in the art, will selectively direct the signal electron beam 26 to the current detector 32 (shown as path 26a), or to the imaging detector 28 (shown as path 26b), depending on the Wien filter polarity. Thus, for a positive operating signal polarity, for example, the Wien filter 34 will direct the signal electron beam to the current detector to ascertain an optimal landing energy ($E_2$), and for a negative operating signal polarity the Wien filter can direct the signal electron beam to the imaging detector for obtaining optimal images of the samples.

The current detector 32 may be a solid state current detector of either a surface junction design—for low energy electron detection—or a semiconductor p-n junction design. The detector may be biased with a relatively low positive voltage (e.g. 50V) to ensure that secondary electrons generated during inelastic events are captured by the detector. Alternatively, the current detector may be a Faraday cup, a large conducting plate or an angled array of carbon nanotubes.

Figure 3:
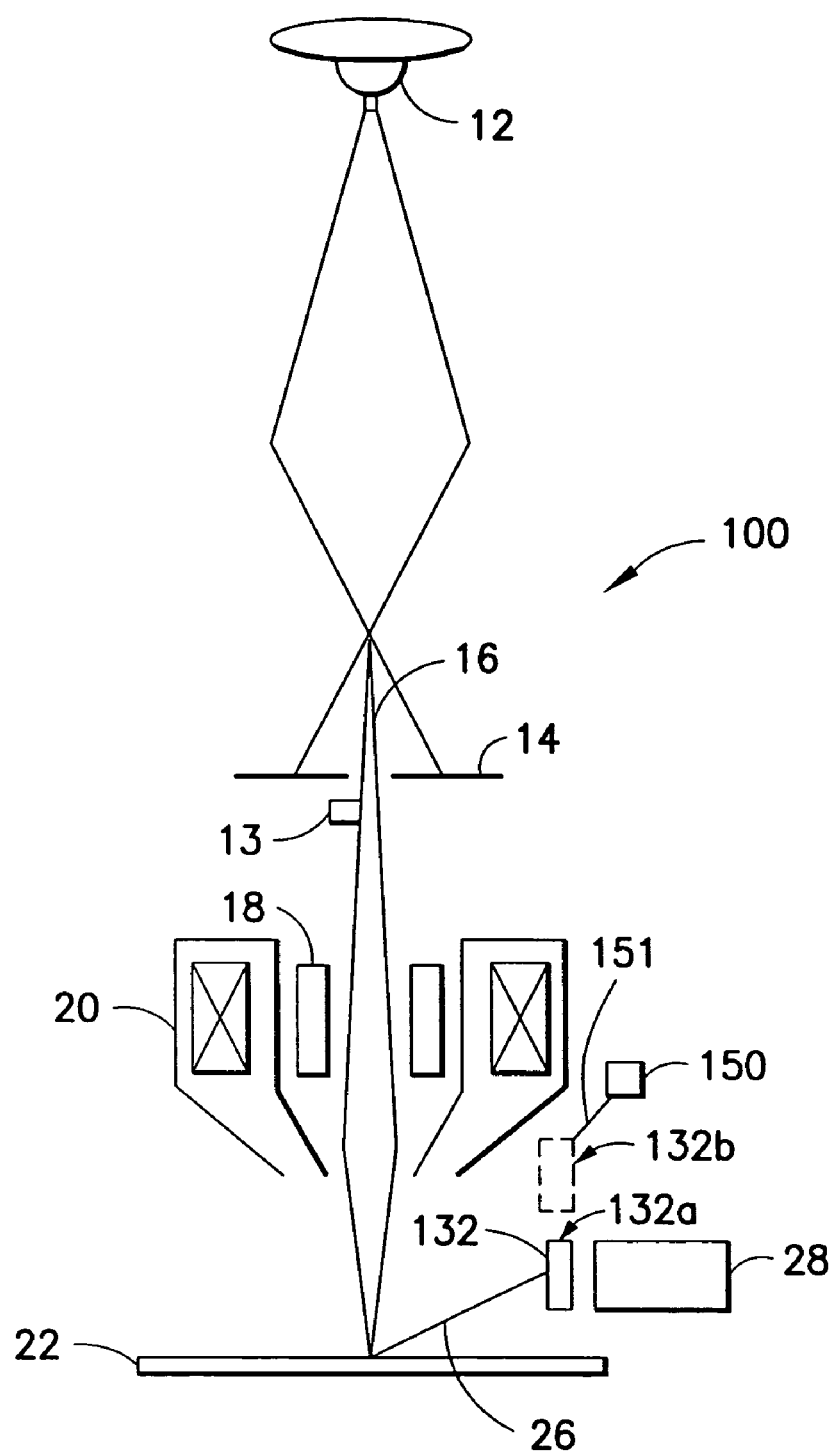
FIG. 3 is a schematic illustration of a scanning electron microscope in accordance with another embodiment of the present invention.

Turning now to FIG. 3, an alternative to the Wien filter 34 arrangement of FIG. 2 is shown. In this embodiment, a scanning electron microscope 100 includes the components of the microscope 10 shown in FIG. 2 except for the Wien filter. A current detector 132 is movable between a first position (shown as 132a) and a second position (shown in phantom as 132b). An actuator 150, which may be mechanical or electrical, may be used, such as via arm 151, to selectively move the current detector into the position at 132a so that the signal electron beam 26 which would be received by the imaging detector 28 is, instead, received by the current detector 132 for providing a current measurement and, hence, an electron yield calculation when compared with the measurement of the probe current detector 13. Alternatively, the actuator 150 may be used to control the imaging detector 28 to receive the signal electron beam that is directed to the current detector 132. To direct the signal electron beam 26 to either the current detector 132 or the imaging detector 28, a positive voltage field will be applied proximate the imaging detector 28 to attract low voltage signal electrons of the signal electron beam 26 to either the current detector 132 or the imaging detector 28 (i.e. depending on the position of the current detector 132.) In this embodiment, once the optimal landing energy $E_2$ is ascertained, the current detector 132 can be moved to position 132b, wherein the identified landing energy $E_2$ will then be used to obtain optimal images of the sample.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method of identifying an optimal landing energy of a probe current in a scanning electronic microscope for use in obtaining an optimal topographic image of a sample, comprising the steps of:
   (a) directing the probe current to the sample at a selected landing energy to produce a signal electron beam from the sample;
   (b) measuring the probe current;
   (c) providing a signal electron beam current detector;
   (d) receiving the signal electron beam at the signal electron beam current detector to obtain a signal electron beam current measurement;
   (e) calculating a ratio of the signal electron beam current measurement to the measured beam energy of the probe current;
   (f) repeating steps (a) through (e) at a landing energy other than the selected landing energy; and
   (g) comparing the calculated ratios at each landing energy to identify the optimal landing energy as a landing energy corresponding to a ratio having a value proximate "1";
   (h) selecting the identified optimal landing energy; and
   (i) obtaining substantially the entire topographic image of the sample by directing the probe current to the sample at a single landing energy which is the optimal landing energy, and directing a resulting signal electron beam to an imaging detector.

2. The method of claim 1, wherein said providing step comprises applying to the sample a voltage having a value proximate a value of the voltage of the probe current, and using the signal electron beam to locate a desired position for the signal electron beam current detector.

3. The method of claim 1, wherein said measuring step (b) comprises disposing a probe current detector in a path of the probe current.

4. The method of claim 1, wherein said receiving step comprises directing the signal electron beam to said signal electron beam current detector.

5. The method of claim 4, wherein said step of directing the signal electron beam further comprises employing a Wein filter disposed in the path of the signal electron beam.

6. The method of claim 1, wherein said steps (d) and (h) are performed by employing a Wien filter disposed in the path of the signal electron beam for selectively directing the signal electron beam to one of said imaging detector and said signal electron beam current detector.

7. The method of claim 1, further comprising the step of selectively positioning said signal electron beam current detector within the path of the signal electron beam.

8. The method of claim 7, wherein said step (c) of providing a signal electron beam detector comprises the step of positioning the signal electron beam detector coplanar with, and at a 180° angle from, said imaging detector.

9. The method of claim 3, wherein said measuring step (b) further comprises using a Faraday cup as the probe current detector.

10. The method of claim 1, wherein said providing step (c) further comprises providing a Faraday cup as the signal electron current detector.

11. The method of claim 7, wherein said selectively positioning step further comprises applying a voltage to one of said signal electron beam and said imaging detector.

12. A system for identifying an optimal landing energy of a probe current in a scanning electronic microscope for use in obtaining an optimal topographic image of a sample, comprising:
　　means for directing the probe current to the sample at a selected landing energy to produce a signal electron beam from the sample;
　　a probe current detector for measuring the probe current;
　　a signal electron beam current detector for obtaining a measurement of the signal electron beam;
　　means for calculating a ratio of the signal electron beam current measurement to the measured beam energy of the probe current;
　　means for obtaining a plurality of signal currents at different landing energies;
　　means for comparing the calculated ratios at each landing energy to identify the optimal landing energy as a landing energy corresponding to a ratio having a value proximate "1";
　　means for selecting the identified optimal landing energy
　　means for obtaining substantially the entire topographic image of the sample by directing the probe current to the sample at a single landing energy which is the optimal landing energy, and directing a resulting signal electron beam to an imaging detector.

* * * * *